United States Patent [19]

Pernisz

[11] Patent Number: 5,283,545
[45] Date of Patent: Feb. 1, 1994

[54] VARIABLE RESISTORS

[75] Inventor: Udo C. Pernisz, Midland, Mich.

[73] Assignee: Dow Corning Corporation, Midland, Mich.

[21] Appl. No.: 915,572

[22] Filed: Jul. 20, 1992

Related U.S. Application Data

[63] Continuation-in-part of Ser. No. 694,721, May 2, 1991.

[51] Int. Cl.$^5$ .............................................. H01C 1/012
[52] U.S. Cl. .................................... 338/308; 338/118; 338/137; 338/160; 338/314; 428/457; 252/518
[58] Field of Search ............... 338/308, 306, 307, 314, 338/118, 137, 160; 428/457; 252/518, 519, 520, 521

[56] References Cited

U.S. PATENT DOCUMENTS

4,600,685  7/1986  Kitakohji et al. .
4,847,162  7/1989  Haluska et al. ..................... 428/457

Primary Examiner—Marvin M. Lateef
Attorney, Agent, or Firm—Roger E. Gobrogge

[57] ABSTRACT

This invention relates to a voltage pulse controlled variable resistor in which at least 2 leads are placed in direct contact with a material containing silica derived from hydrogen silsesquioxane. The resistor is formed by depositing a silica film derived from hydrogen silsesquioxane resin between at least two electrodes. The resistance of the component is varied by applying voltage pulses to the leads.

30 Claims, 6 Drawing Sheets

VARIABLE RESISTORS

This is a continuation in part of copending application Ser. No. 07/694,721 filed on May 2, 1991.

BACKGROUND OF THE INVENTION

This invention relates to a method of forming threshold switching devices which exhibit negative differential resistance and to the devices formed thereby. The method comprises depositing a silicon dioxide film derived from hydrogen silsesquioxane resin between at least two electrodes and applying a voltage above a threshold voltage across the electrodes. Such devices are useful as variable resistors.

Numerous devices which exhibit threshold switching are known in the art. For example, Ovshinsky in U.S. Pat. No. 3,271,591 describes such devices in which semiconductor materials, such as crystalline or amorphous tellurides, selenides, sulfides or oxides of substantially any metal, are deposited between electrodes. The semiconductors and methods specifically set forth in this reference, however, are not the same as those claimed herein. As such, the j-V curves in this reference differ from those of the present application.

Threshold switching with negative differential resistance is also known in various metal oxide thin films. For instance, Bullot et al., Phys. Stat. Sol. (a) 71, K1 (1982), describe threshold switching in vanadium oxide layers deposited from gels; Ansari et al., J. Phys. D:Appl. Phys. 20 (1987) 1063–1066 describe threshold switching in titanium oxide films formed by thermally oxidizing a titanium metal layer; Ramesham et al., NASA Tech Briefs, December 1989, p. 28, describe the switching in manganese oxide films and Morgan et al., Thin Solid Films, 15 (1973) 123–131, describe switching and negative differential resistance in aluminum oxide films. The materials and characteristics described in these references, however, differ from those described herein.

The switching and negative differential resistance characteristics of silicon oxide films have likewise been described. For instance, Simmons, Handbook of Thin Film Technology, Chapter 14 (1970), describes electronic conduction through thin insulating films, including silicon oxide, as well as their negative resistance and memory characteristics Al-Ismail et al., J. Mat. Sci. 20 (1985) 2186–2192, describe switching and negative resistance in a copper-silicon oxide-copper system; Morgan et al., Thin Solid Films, 20 (1974) S7–S9, describe threshold switching and memory in silicon oxide films; Boelle et al., Applied Surface Science 46 (1990) 200–205, describe the current voltage characteristics of silica films derived from sol-gel low temperature methods; and Klein, J. Appl. Phys., 40 (1969) 2728–2740, describe the electrical breakdown of silicon oxide films. As with the prior metal oxide references, however, these too do not describe the methods and characteristics described herein.

Resistors produced form ceramic oxides are also known in the art. For instance, Eijnthoven et al. and Nagano et al. describe resistors derived primarily from zinc oxide and titanium oxide, respectively. Such materials and the resultant properties, however, differ from those claimed herein.

Thin film silica coatings derived from hydrogen silsesquioxane resin are also known in the art. For instance, Haluska et al. in U.S. Pat. No. 4,756,977 describe forming such films by diluting hydrogen silsesquioxane resin in a solvent, applying the solution to a substrate, drying the solvent, and heating. Such coatings are taught therein to provide protection and electrical insulation.

The present inventors have now found that switching devices with desirable features can be formed by depositing a thin, hydrogen silsesquioxane derived silicon dioxide film between at least 2 electrodes and applying a voltage above a threshold voltage across the electrodes. These devices are useful as variable resistors.

SUMMARY OF THE INVENTION

The present invention relates to a method of forming a threshold switching device having negative differential resistance. The method comprises depositing a nondense silicon dioxide film derived from hydrogen silsesquioxane resin between at least two electrodes. A voltage above a certain threshold voltage is then applied across the electrodes to complete formation of the device.

The device formed in this manner is characterized in that 1) the conductive state of the thin film can be converted to the resistive state with memory by decreasing the applied voltage from a sufficiently high value to a value below the threshold voltage at a sufficiently high rate, 2) it can be converted from a resistive state to a conductive state with memory by the application of a threshold voltage and 3) the application of voltage above a threshold voltage results in the film exhibiting stable negative differential resistance.

The present invention also relates to variable resistors comprising at least 2 leads in direct contact with a material comprising silica derived from hydrogen silsesquioxane.

DETAILED DESCRIPTION OF THE INVENTION

The present invention is based on the discovery that thin films of silicon dioxide derived from hydrogen silsesquioxane resin (thin films) exhibit novel threshold switching and negative differential resistance. This was particularly unexpected since the thin films herein are conventionally used as electrical insulation materials.

These novel devices show features beyond those taught in the prior art. For instance:

1. The devices can carry high current density (e.g., 1 $A/cm^2$);
2. The devices have been shown to operate with thick films (e.g., 1 micron) whereas the prior art teaches that the effect does not occur in films greater than 500 nM thick; and
3. The whole jV curve, especially the negative differential resistance region, has been shown to be stable and monotonic.

As used in this disclosure, the expressions "hydrogen silsesquioxane resin" or "H-resin" are meant to include those hydridosilane resins which are fully condensed [$(HSiO_{3/2})_n$] as well as those which are only partially hydrolyzed and/or partially condensed and, thereby, may contain residual SiOR and/or SiOH substituents (wherein OR is a hydrolyzable group) and the expression "thin film" is used to describe the silicon dioxide films derived from hydrogen silsesquioxane.

Figure 1:
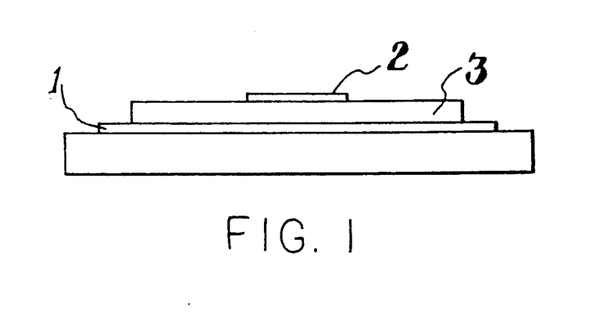

The invention will be described with specific reference to the figures. FIG. 1 is a cross-sectional view of a representative threshold switching device or variable resistor of this invention wherein electrodes (1) and (2)

are separated by the thin film (3). Although this Figure exemplifies a sandwich electrode configuration, such an arrangement is not critical and nearly any configuration appropriate for a given device application may be used. For example, arrangements such as coplanar, transplanar, crossed grid arrays, two dimensional circular dot pattern, etc. may be used.

The shape of the electrodes and the materials from which they are constructed may be any conventionally known in the art. For instance, the electrodes can be made of nearly any electrically conductive or semiconductive material such as gold, silver, aluminum, platinum, copper, gallium arsenide, chromium, silicon, etc. Likewise, the electrodes can be used in nearly any shape or form desired, such as a wire or a conventional lead, provided they have at least enough device area to enable the desired current flow. Particularly preferred herein is the use of gold electrodes.

Contact between the electrodes and the thin film can be established by techniques well known in the art. For instance, the electrodes may be formed on the thin film by evaporating or sputtering the appropriate electrode material in vacuum. Alternatively, the thin film may be deposited directly onto preformed electrodes to create the appropriate contact or the preformed electrodes may be adhered to the thin film by conventional techniques.

The thin films (3) of this invention comprise silicon dioxide derived from hydrogen silsesquioxane resin. Generally, these films may be of any thickness desired. Those in the range of between about 50 and 5,000 nM are, however, preferred with those in the range of between about 100 and 600 nM being especially preferred.

Such thin films may be formed by any appropriate method. A particularly preferred technique comprises coating a substrate with a solution comprising a solvent and hydrogen silsesquioxane resin, evaporating the solvent to form a preceramic coating and then converting the preceramic coating to the thin film. Other equivalent methods, however, are also contemplated herein.

As defined above, the hydrogen silsesquioxane resins which may be used in this invention are those with the structure $(HSiO_{3/2})_n$. Such resins are generally produced by the hydrolysis and condensation of silanes of the formula $HSiX_3$, wherein X is a hydrolyzable group, and they may be either fully hydrolyzed and condensed $(HSiO_{3/2})_n$ or their hydrolysis or condensation may be interrupted at an intermediate point such that partial hydrolyzates (which contain Si—OR groups wherein OR is a hydrolyzable group) and/or partial condensates (which contain SiOH groups) are formed. Alhough not represented by this structure, these resins may contain a small percentage of silicon atoms which have either no hydrogen atoms or more than one hydrogen atom attached thereto due to various factors involved in their formation or handling.

Various methods for the production of these resins have been developed. For instance, Collins et al. in U.S. Pat. No. 3,615,272, which is incorporated herein by reference, describe a process of forming nearly fully condensed H-resin (which may contain up to 100-300 ppm silanol) comprising hydrolyzing trichlorosilane in a benzenesulfonic acid hydrate hydrolysis medium and then washing the resultant resin with water or aqueous sulfuric acid. The resultant polymeric material has units of the formula $(HSiO_{3/2})_n$ in which n is generally 8-1000 and has a number average molecular weight of from about 800-2900 daltons and a weight average molecular weight of between about 8000-28,000 daltons.

Similarly, Bank et al. in U.S. Pat. No. 5,010,159 hereby incorporated by reference, teach methods of forming such resins (which may contain up to 1000 ppm silanol) comprising hydrolyzing hydridosilanes in an arylsulfonic acid hydrate hydrolysis medium to form a resin which and then contacting the resin with a neutralizing agent. A preferred embodiment of this latter process uses an acid to silane ratio of about 6/1.

Other methods, such as those described by Frye et al. in U.S. Pat. No. 4,999,397, hereby incorporated by reference, comprising hydrolyzing trichlorosilane in a non-sulfur containing polar organic solvent by the addition of water or HCl and a metal oxide or a method which comprises hydrolyzing a hydrocarbonoxy hydridosilane with water in an acidified oxygen-containing polar organic solvent, also produce such hydridosiloxane resins and are functional herein.

The H-resin is then deposited on the surface of the substrate. This can be accomplished in any manner, but a preferred method involves dissolving the H-resin in a solvent to form a solution and then applying this solution to the surface of the substrate. Various facilitating measures such as stirring and/or heating may be used to aid in the dissolution. Solvents which may be used include any agent or mixture of agents which will dissolve the H-resin to form a homogenous solution without affecting the thin film or its switching properties. These solvents can include, for example, alcohols such as ethyl or isopropyl, aromatic hydrocarbons such as benzene or toluene, alkanes such as n-heptane or dodecane, ketones, esters, glycol ethers, or cyclic dimethylpolysiloxanes, in an amount sufficient to dissolve the above materials to low solids. Generally, enough of the above solvent is used to form a 0.1-50 weight percent solution.

Besides H-resin, the coating solution may also include a modifying ceramic oxide precursor such that the resultant ceramic coating comprises a mixed silicon/metal oxide. Such precursors can include, for example, compounds of various metals, such as iron aluminum, titanium, zirconium, tantalum, niobium and/or vanadium. These compounds generally form either solutions or dispersion when mixed with the H-resin and must be capable of being subsequently pyrolyzed at relatively low temperatures and relatively rapid reaction rates to form modifying ceramic oxide coatings. When such a modifying ceramic oxide precursor is used, it is generally present in the preceramic mixture in an amount such that the final coating contains 0.1 to 30% by weight modifying ceramic oxide.

Examples of modifying ceramic oxide precursors include tetra n-propoxy zirconium, tetraisobutoxy titanium, aluminum trispentanedionate, pentaethoxy tantalum, tripropoxy vanadium, pentaethoxy niobium, zirconium pentanedionate, and titanium dibutoxy bispentanedionate.

If modifying ceramic oxide precursors are to be included in the H-resin preceramic solution, they may be simply dissolved in the solution comprising the H-resin and the solvent and allowed to stand at room temperature for a time sufficient to allow the modifying ceramic oxide precursor to react into the structure of the H-resin. Generally, a period of greater than about 2 hours is necessary for said reaction to occur. The solution may then be applied to the substrate as discussed infra. Alternatively, the modifying ceramic oxide precursor may be hydrolyzed or partially hydrolyzed, dissolved in the solution comprising the solvent and H-resin and then immediately applied to the substrate. Various facilitating measures such as stirring or agitation may be used as necessary to produce said solutions.

A platinum, rhodium or copper catalyst may also be used herein to increase the rate and extent of hydrogen silsesquioxane resin conversion to silicon dioxide. Generally, any platinum, rhodium or copper compound or complex which can be solubilized will be functional. For instance an composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of H-resin.

If the above solution method is used, the coating solution is applied by techniques such as spin coating, dip coating, spray coating or flow coating and the solvent allowed to evaporate. Any suitable means of evaporation may be used such as simple air drying by exposure to an ambient environment or by the application of a vacuum or mild heat.

The resultant preceramic coating is then converted to the silicon dioxide thin film. Generally, this is done at a temperature and in an environment which will not result in the formation of a fully dense film (2.2 g/cm$^3$). For instance, such silicon dioxide films may be formed by heating the preceramic coating in air at a temperature of from about 100° to about 600° C. For other environments (e.g. ammonia, oxygen, nitrogen, etc.), however, the temperature may vary.

It is generally important that the resultant thin film is not completely dense so that the observed behavior can occur. The exact density, however, is not critical and can vary over a wide range. Generally, the density is in the range of between about 40 and 95%, with densities in the range of between about 60 and 90% being preferred.

After the thin film is formed, the necessary electrodes are attached in the manner described above such that a voltage can be applied across the thin film.

A newly created device prepared in this manner initially exhibits an undefined, non-specific resistance. For instance, some devices may exhibit resistance values as low as 1 ohm while others exhibit values above 10 megohm. Those with very low resistance often have shorts between the electrodes due to pin holes and other device flaws. If present, such shorts should be "blown out" by applying a voltage sufficiently high to vaporize the electrode around the short (e.g., 10–20 V from a low impedance voltage source).

Voltage is then slowly applied across the film of the device and increased until the threshold voltage is reached, at which point the resistance of the device suddenly falls. Upon such a voltage application, the device is completely formed and it remains in its low resistance state.

To obtain lower threshold voltages and more reproducible results, the devices of the invention may be placed in a non-oxidizing environment. Examples of suitable environments include nitrogen, argon, helium, carbon dioxide and the like. Alternatively, however, establishing a vacuum or encapsulating the device can also provide the desired environment.

The following discussion describes the characteristics of a typical device formed in the above manner and the procedures to switch the device from its ON state to an OFF state and back again. The typical device consists of a silica thin film with a thickness of about 200 nM and device area of about 0.1 cm$^2$. A voltage (measured in volt (V)) is applied across the electrodes, and the current through the device as well as the voltage across the device are both measured. The current, measured in ampere (A) is converted to a current density and given in A/cm$^2$. The results are plotted in a diagram of current vs. voltage and referred to as a jV curve. The following values are only representative of the above device and are not meant to be limiting.

Threshold switching, as displayed by this device, is similar to that known in the art for other thin films. As voltage less than the threshold voltage (about 3 V) is applied to an electrode thereon, the thin film exhibits a high impedance as would normally be associated with an insulator. The resistivity of the device in this "OFF" state is generally in the range of between about $10^8$ ohm cm and about $10^{11}$ ohm cm. When the applied voltage is raised above this threshold voltage, however, the thin film is rapidly converted to a state of low resistivity and the device supports a high current density. The resistivity in this "ON" state is typically in the range of between about $10^4$ ohm cm and about $10^7$ ohm cm.

Figure 2:
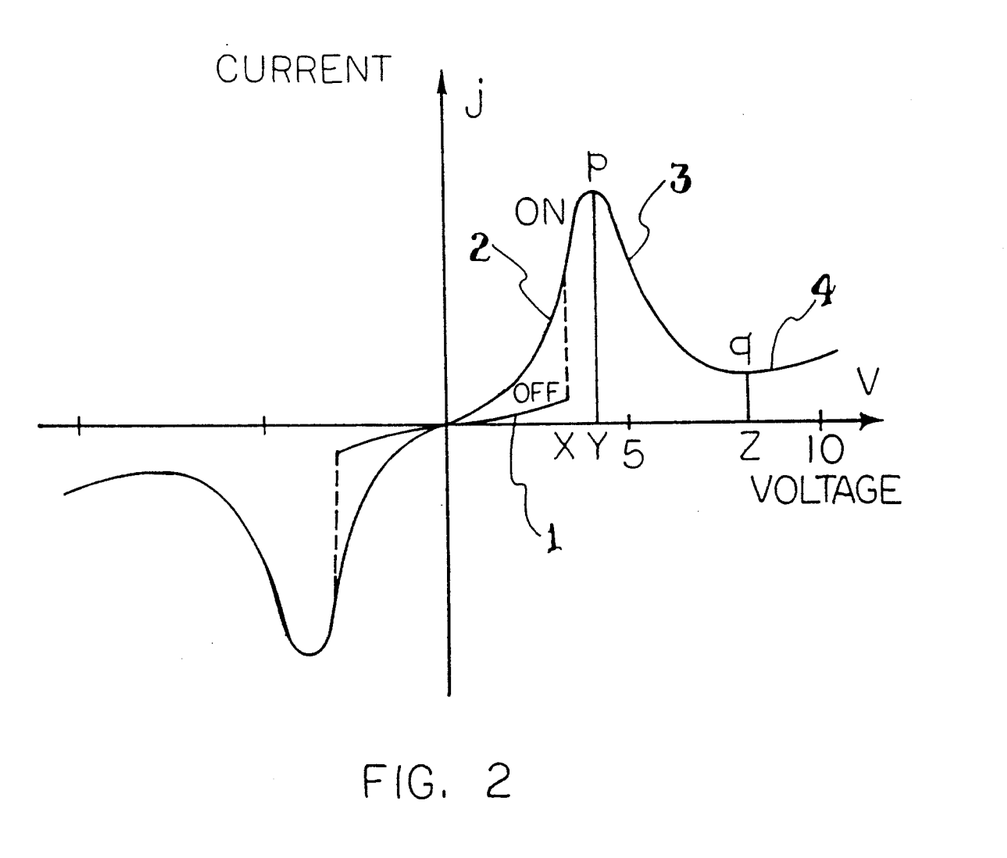

This threshold switching behavior is graphically displayed in FIG. 2. Line 1 shows that when the device is in the OFF state, the current density increases only slightly as the applied voltage is increased. When the applied voltage reaches the threshold voltage, x, the device rapidly switches from the OFF state to the ON state wherein the current density is suddenly increased by 2 or three orders of magnitude or more (dotted line). It is essential for the transition to the ON state to occur as depicted schematically in FIG. 2 that the ambient of the device is free of oxygen or other oxidizing gaseous species. This condition is assumed to pertain throughout the remainder of the discussion of the resistive properties of devices according to this invention.

Once in this ON state, the jV tracing follows lines 2, 3 and 4 wherein the current rises steeply with voltage in the first quadrant (line 2) (and, symmetrically to it, in the third quadrant) until it reaches a maximum current, (p), at a voltage (y). Increasing the voltage beyond this value results in a decrease in current density until a minimum (q) is reached at voltage (z). i.e., the device exhibits a voltage controlled negative differential resistance, or NDR (line 3). Typically the values for (y) range between 4–6 V and for (z) between 8–10 V. At voltages above (z), the jV curve show the high resistivity characteristic of an insulator (line 4).

Especially advantageous in devices of this invention is the fact that the jV curve is wide and "stable" in the NDR region. i.e., no uncontrollable transitions occur as the applied voltage is changed, although the jV curve is noisier in this region than in the low voltage part (line 2). Thus, any point on the jV curve can be isolated and maintained, provided the source impedance of the voltage supply is smaller by magnitude than the negative differential resistance of the device at that point.

The jV curve of the device in its ON state can be completely traced out for both increasing and decreasing voltages, through the maximum, at a sufficiently low rate of change of the applied voltage. In particular, the curve is continuous through the origin which means (i) there is no holding current necessary to maintain the ON state, and (ii) the device has a "memory" of the ON state even when no voltage is applied.

Figure 3:
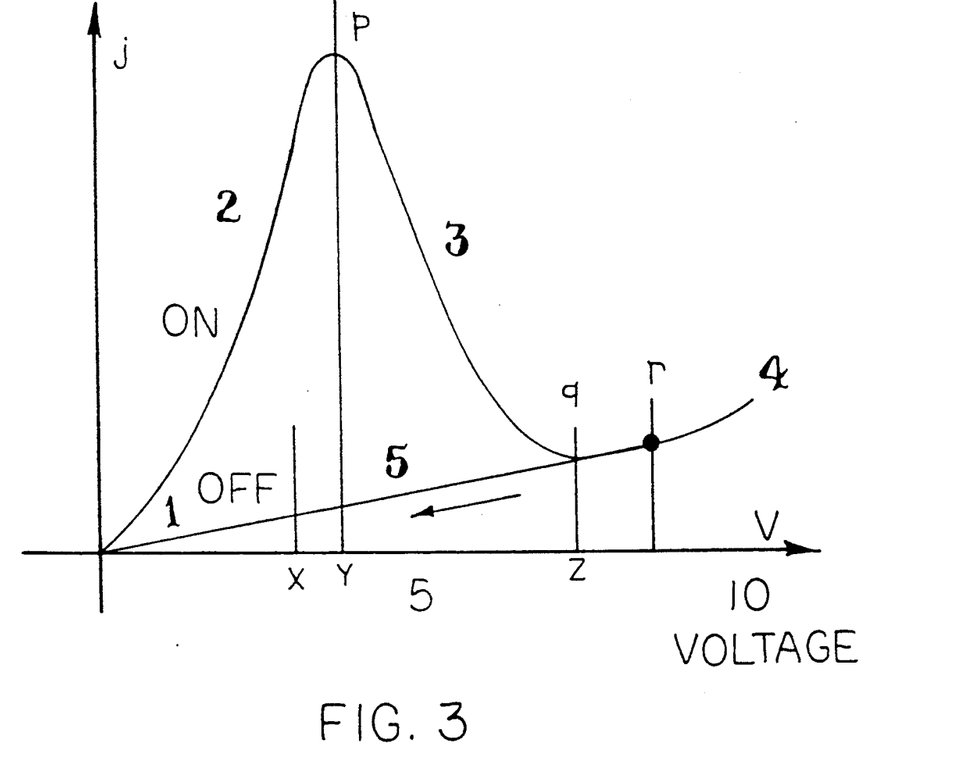

To convert the device from the ON state to the OFF state requires that the applied voltage be removed or reduced to a value around zero at a sufficiently high slew rate from a voltage above (z). As shown in FIG. 3, the jV curve of the device does not go through the current peak (p) when the applied voltage is rapidly lowered in this manner. Rather, it follows a direct, nearly linear path (line 5). Typical slew rates for efficiently switching the device OFF are greater than about 1 V/mS (millisecond) with rates greater than about 1000 V/mS being preferred. It is to be noted that a device in the ON state may be turned OFF by a voltage pulse starting from zero, provided the pulse voltage is larger, or approximately equal to (z) (i.e., the pulse reaches into line 4) and the fall time of the pulse meets the slew rate requirement. Typically, a voltage of 10 V for a duration of 1 microsecond or longer is adequate.

When the device is turned OFF in the above manner, it has a high resistance, typically 2 or 3 orders of magnitude higher than in the ON state. The resistance can be determined by measuring the jV curve in the OFF state over a small range of the applied voltage (up to the threshold voltage). The device will remain in the OFF state as long as the applied voltage does not exceed the threshold voltage. Such a device in the OFF state can be converted to the ON state as described above.

Figure 8:
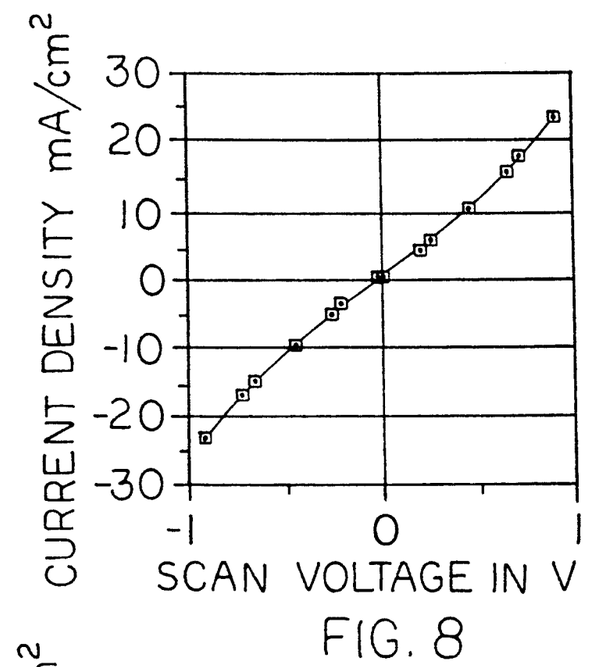
Figure 9:
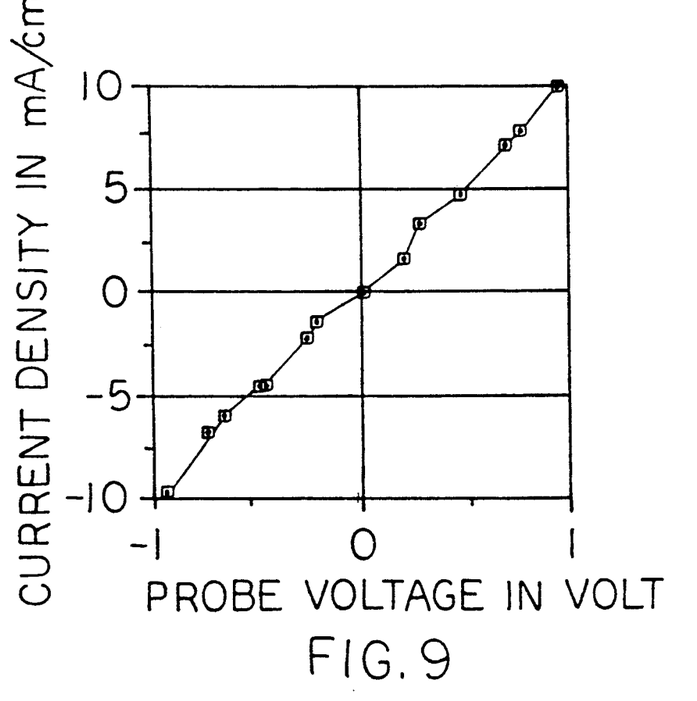

The two cases of the ON state and the OFF state of a device are presented in FIG. 8 and FIG. 9, respectively, which show measurements of the jV characteristics over a range of the applied voltage between $-1$ V and $+1$ V. From the device area A (0.15 cm$^2$) and the current densities $j_{ON}$ and $j_{OFF}$ obtained at a specific voltage, for instance U=1 V, the resistance $R_{ON}$ and $R_{OFF}$ of the device in its two states can be calculated as:

$$R_{ON} = U/j_{ON}A \text{ and } R_{OFF} = U/j_{OFF}A.$$

With the values from FIGS. 8 and 9, the ON resistance is calculated as 270 Ohm while for the OFF resistance 670 Ohm is obtained. The resistance ratio achieved with this device is 2480.

As set forth above, these resistances can be readily interchanged by the application of appropriate voltage pulses. At voltages below the threshold the resistance values of the device are stable.

The effects described above suggest potential applications for these devices as switches, sensors, memory elements, etc. In particular, it can be seen that the device is useful as a voltage pulse controlled variable resistor.

In addition, the present inventors have discovered that the application of voltage pulses that vary between the threshold voltage (x in FIG. 3) and the current minimum at point q (z in FIG. 3) results in device resistances ranging between the fully ON and the fully OFF state (compare FIGS. 8 and 9, respectively).

Figure 10:
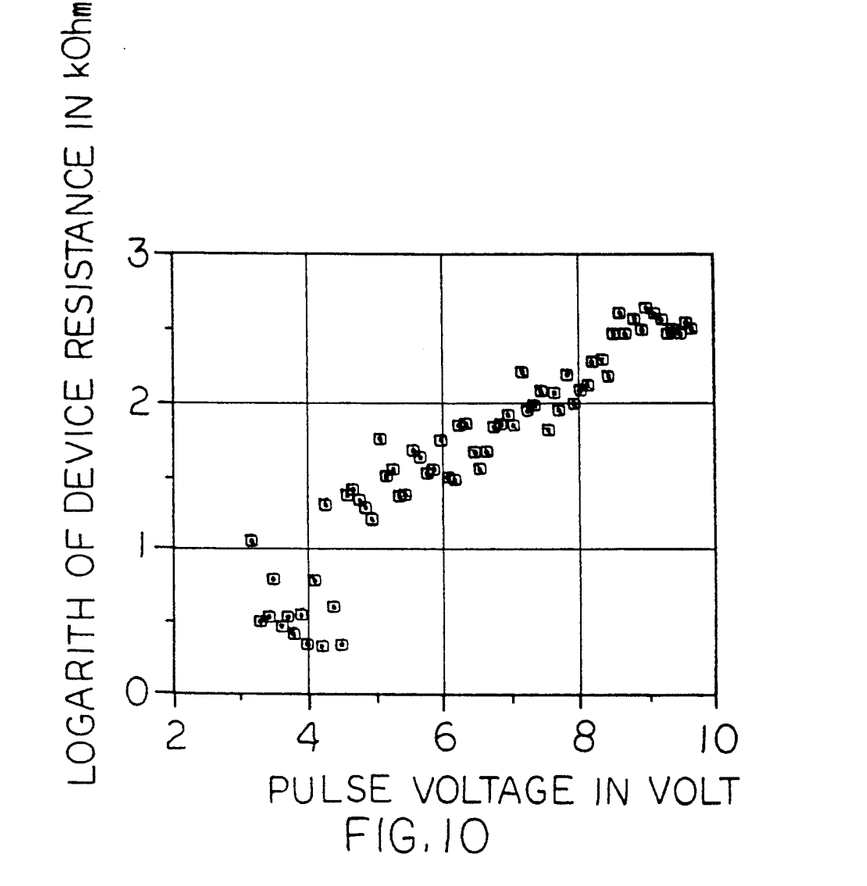

FIG. 10 depicts the functional dependence of the resistance of this device on the pulse voltage. The resistance data are plotted logarithmically (base 10) on the ordinate axis. The Figure shows that the resistance increases with increasing pulse voltage, covering a continuous range of resistance values of more than two orders of magnitude.

Utilizing the device as a continually variable resistor according to the present invention is particularly valuable since this wide range of resistance values can be achieved using only two electrodes. By contrast, prior art requires either mechanical manipulation or additional control electrodes to alter the resistance of a variable resistor.

Although the mechanism for the effects described above is not fully known, the inventors have shown that the nanostructure of the thin film is essential for switching and negative differential resistance. In particular, the structure of the electronic states associated with the internal surfaces of silicon dioxide derived from hydrogen silsesquioxane are assumed to be responsible for the behavior of the material. The mechanism for switching between the ON and OFF states is proposed to be a solid state electrochemical redox reaction involving the electronic states discussed above.

The following non-limiting Examples are provided so that those skilled in the art will understand the invention.

EXAMPLE 1

Figure 4:
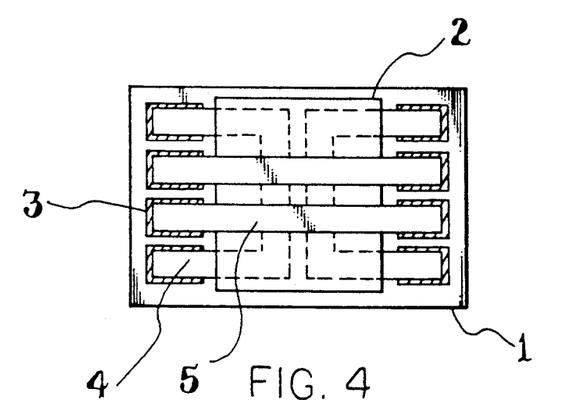

FIG. 4 shows the device created by this Example. 8 contact pads (3) were applied to a 1"×1.5" Corning 7059 glass slide (1) by a silk screening process using gold frit paste (conductive coating #8835 by Electroscience Laboratories). The slide with the silk screened contact pads was dried in air at 150° C. and then baked at 520° C. for 30 minutes. Back electrodes (4) were then deposited across the contact pads. These electrodes were deposited by a process which comprised placing the slide in a deposition chamber which was pumped down to 1 mPa using liquid nitrogen in a cold trap, establishing an argon glow discharge therein at a suitable pressure between 1.5 and 3 kV for 10 minutes, and evaporating a 3 nm thick layer of chromium and a 180 nm thick layer of gold through a stainless steel mask.

The contact pads on the slide were masked and a 135 nm thick silicon dioxide thin film (2) was then applied to the surface of the slide. The thin film was applied by diluting hydrogen silsesquioxane resin (prepared by the method of Bank et al. in U.S. Pat. No. 5,010,159) to about 10% in a cyclic dimethylpolysiloxane solvent, coating the surface of the slide with this solution, spinning the slide at 3000 RPM for 10 seconds and pyrolyzing the slide in a furnace in air for 3 hours at 400° C. to form the thin film.

Top electrodes (5) were then deposited on the thin film by the same process as before which comprised placing the slide in a deposition chamber which was pumped down to 1 mPa using liquid nitrogen in a cold trap and then evaporating a 100 nm thick layer of gold through a stainless steel mask. The area of the device was 0.15 cm$^2$.

This device was then mounted in a measurement chamber where the electrodes of one of the four devices were connected to the measuring equipment by applying wires to the contact pads. The chamber was then purged with nitrogen and a variable voltage was applied across the thin film. The voltage V across the device and the current I through the device were measured for each voltage and the current density j was calculated from the device area A.

Figure 5:
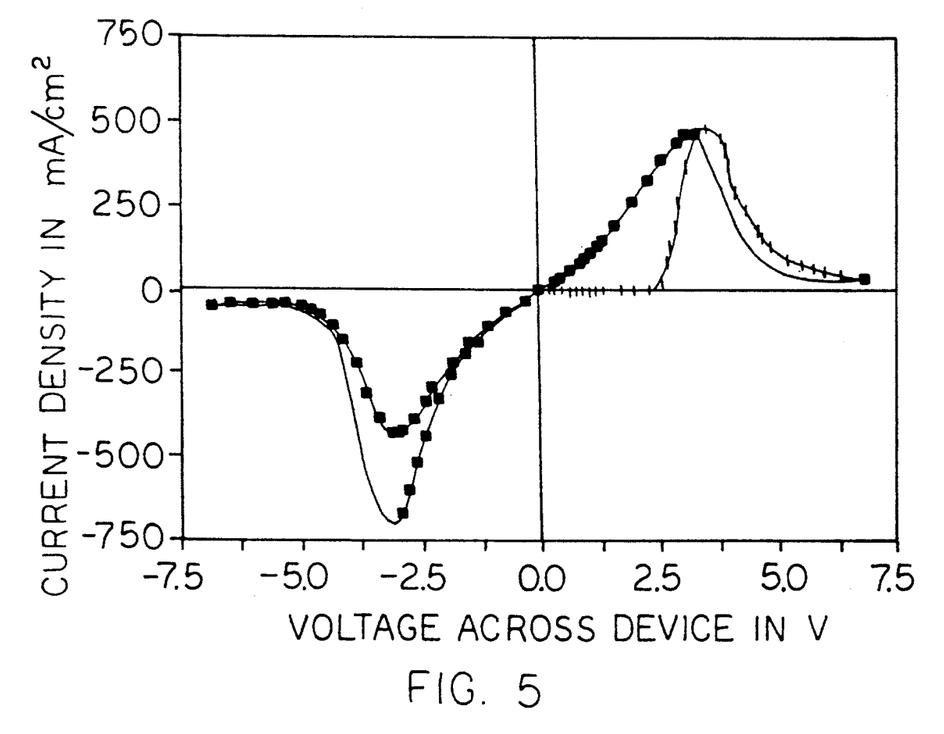

The j-V curve of FIG. 5 was obtained from this device. This curve clearly shows the transition of the device from its OFF state to its ON state (line with the hash marks) as well as a full curve of the device in its ON state (line with boxes and unmarked line).

EXAMPLE 2

A device was created in the same manner as in Example 1 except for the method of film formation. In this Example the thin film was applied by diluting hydrogen silsesquioxane resin (prepared by the method of Bank et al. in U.S. Pat. No. 5,010,159) to about 25% solids in a solvent comprising a mixture of heptane (5% by wt) and dodecane (95% by wt), coating the surface of the slide with this solution, spinning the slide at 3000 RPM for 10 seconds and pyrolyzing the slide in a furnace in air for 3 hours at 400° C. The resultant film was about 450 nm thick. After this film had cooled, a second thin film was deposited on top of the first in the same manner as before. The dual layer film was then approximately 910 nm thick.

Top electrodes were then deposited in the same manner as Example 1. The j-V characteristics were measured and showed nearly the same results as Example 1.

This Example shows that the thin films of this invention are not thickness limited as in the prior art.

EXAMPLE 3

A device was created in the same manner as in Example 1 except for the method of film formation. In this Example a coating solution was formed by mixing 0.462 g $Fe(O_2C_5H_7)_3$, 0.487 g hydrogen silsesquioxane resin (prepared by the method of Bank et al. in U.S. Pat. No. 5,010,159), and 9.9 g 2,4 pentandione. This solution was coated onto the surface of the slide, the slide was spun at 1500 RPM for 15 seconds and the coated slide was pyrolyzed in a furnace in air for 1 hours at 400° C.

Top electrodes were then deposited in the same manner as Example 1. The j-V characteristics were measured and showed nearly the same results as Example 1.

EXAMPLE 4 (COMPARATIVE)

A device was created in the same manner as in Example 1 except for the method of film formation. In this Example the thin film was formed from Accuglas ™ 305 (lot 7794) (an organopolysiloxane) by coating the surface of the slide with this solution, spinning the slide at 3000 rpm for 10 seconds and pyrolyzing the slide in a furnace in air for 1 hour at 400° C. The resultant film was about 200 nm thick.

Figure 6:
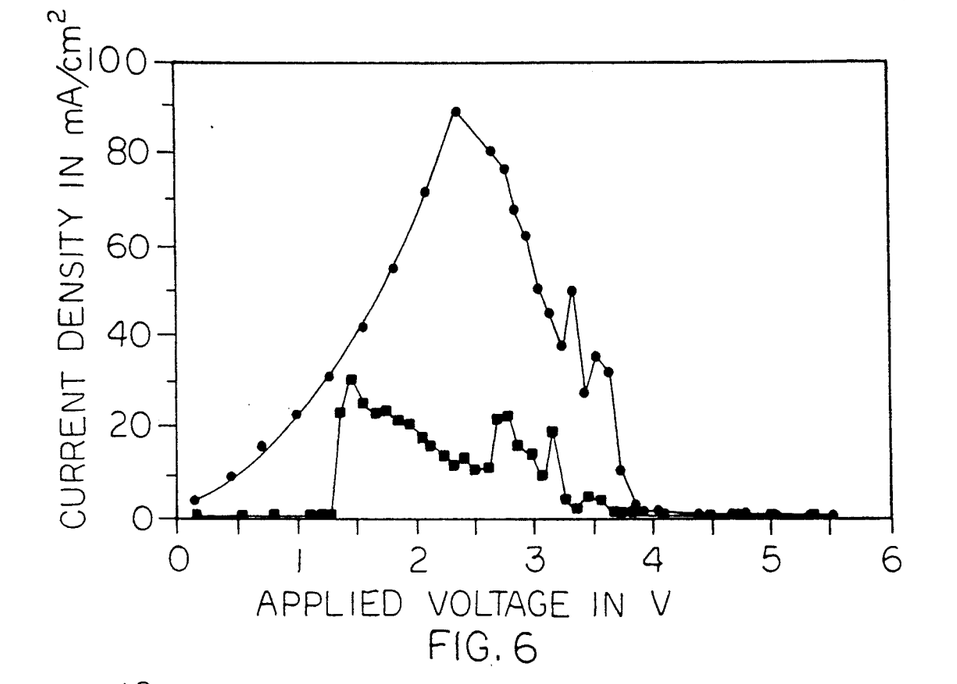

Top electrodes were then deposited in the same manner as Example 1. The j-V characteristics were measured and are displayed in FIG. 6 (increasing voltage=-line with squares; decreasing voltage=line with circles). This Figure shows that thin films derived from other silica precursors differ from those derived from H-resin. Specifically, this Figure shows that the threshold voltage for the ON transition is much lower, the NDR regime is wide and noisy, and the jV characteristic is erratic.

EXAMPLE 5 (COMPARATIVE)

A device was created in the same manner as in Example 1 except for the method of film formation. In this Example the thin film was formed by a vapor deposition process which comprised placing the slide in an electron cyclotron resonance reactor and kept at a substrate temperature of 450° C. A source gas mixture of 25% $SiH_4$ and 75% Ar and $O_2$ for a ratio of $O_2:SiH_4=2.2:1$ was admitted into the reactor at a total pressure of 1 Pa and a microwave plasma was maintained in the reactor at a power of 400 W for 12 minutes. The resultant film was about 170 nm thick.

Figure 7:
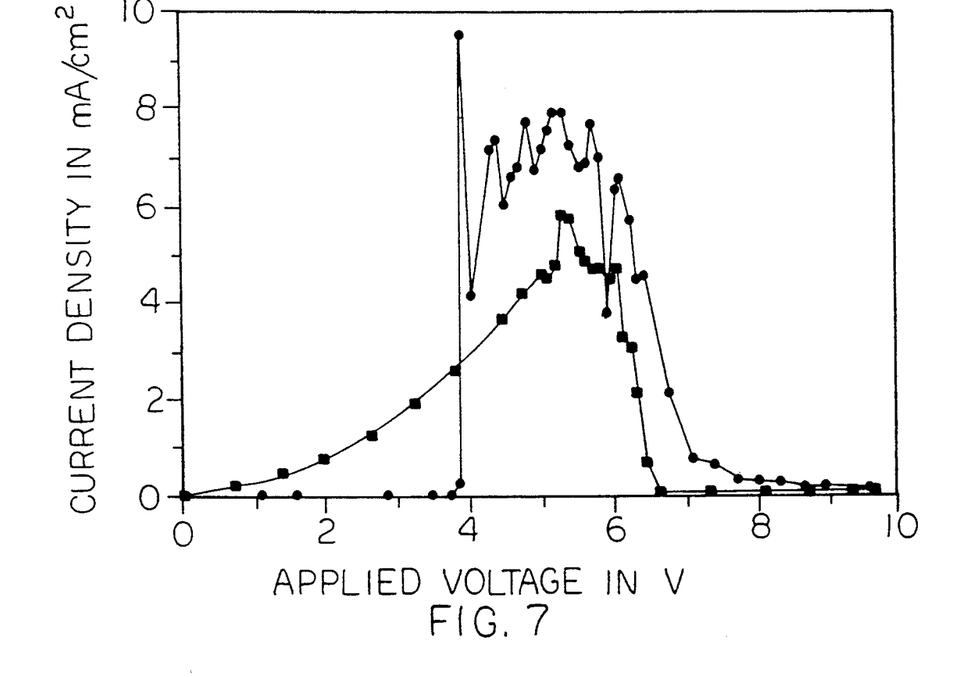

Top electrodes were then deposited in the same manner as Example 1. The j-V characteristics were measured and are displayed in FIG. 7 (increasing voltage=-line with circles; decreasing voltage=line with squares). This Figure shows that thin films formed by chemical vapor deposition differ from those derived from H-resin. Specifically, this Figure shows 1) a low ON current and small ON/OFF ratio, 2) higher threshold voltage for ON transition, 3) a very steep NDR regime, and 4) the jV characteristic is erratic.

EXAMPLE 6

Figure 11:
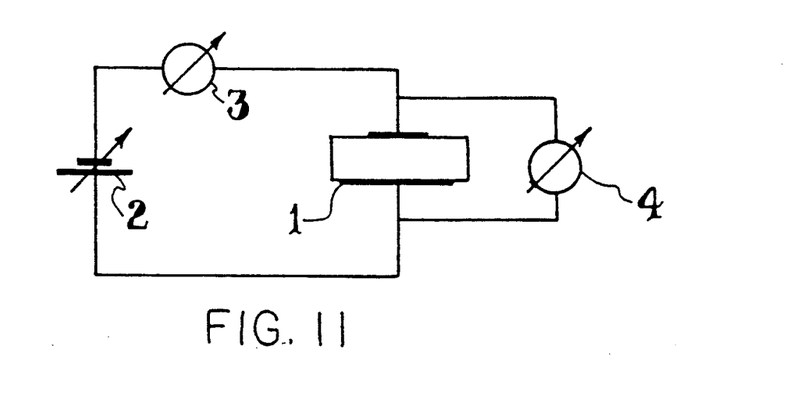

The device of Example 1 was placed in the electrical circuit of FIG. 11 to show its use as a resistor. The device (1) is connected to a variable voltage source (2) with a current meter in series (3) (the current meter consists of a calibrated measurement resistor and a voltmeter to measure the voltage drop across it). A voltmeter (4) connected across the two terminals of the device measures the voltage applied to the device.

The variable voltage source (2) provides two functions:

(i) It serves as a voltage source to which the variable resistor is connected to obtain a current according to the device's resistance at voltages below the threshold voltage of the device. In this mode the jV curves of the resistor at its two extreme resistance values were obtained which are shown in FIGS. 8 and 9.

(ii) The voltage source (2) also serves as the source for the pulse voltages with which the resistance of the variable resistor device can be altered according to the resistor characteristic shown in FIG. 9. The data points were obtained by pulsing the resistor with a voltage (abscissa values) and then measuring the current through the resistor at an applied voltage of 1 V. The resistance calculated from the measured values are plotted logarithmically on the ordinate.

That which is claimed is:

1. A variable resistor comprising:
   at least 2 electrodes in direct contact with an oxide material comprising silica derived from a precursor comprising hydrogen silsesquioxane.

2. The resistor of claim 1 wherein the resistor is placed in a non-oxidizing atmosphere.

3. The resistor of claim 1 wherein the oxide material is in the form of a film deposited by a process which comprises coating a substrate with a solution comprising hydrogen silsesquioxane in a solvent, evaporating the solvent to form a coating and then pyrolyzing the coating to form the oxide material.

4. The resistor of claim 3 wherein the coating is pyrolyzed at a temperature in the range of from about 100° C. to about 600° C.

5. The resistor of claim 3 wherein the solution also contains a platinum, rhodium or copper catalyst composition in an amount of about 5 to about 1000 ppm platinum, rhodium or copper based on the weight of hydrogen silsesquioxane resin.

6. The resistor of claim 1 wherein the electrodes are separated by a distance of less than about 5000 nm.

7. The resistor of claim 1 wherein the oxide material has a density between about 0.9 and about 2.1 g/cc.

8. The resistor of claim 1 wherein the electrodes are made of a material selected from the group consisting of gold, aluminum, silver, copper, platinum, nickel, cobalt, gallium arsenide, and silicon.

9. The resistor of claim 3 wherein the substrate is selected from the group consisting of gold, aluminum, silver, copper, platinum, nickel, cobalt, gallium arsenide, silicon, silicon carbide, silica, alumina, aluminum nitride, and silicon nitride.

10. The resistor of claim 1 wherein at least one electrode is made of gold.

11. The resistor of claim 1 wherein the oxide material is between about 50 and about 5000 nm thick.

12. The resistor of claim 1 wherein the oxide material is between about 100 and about 600 nm thick.

13. The resistor of claim 1 wherein one or more modifying ceramic oxides are incorporated in the oxide material.

14. The resistor of claim 13 wherein the modifying ceramic oxide comprises an oxide of one or more elements selected from the group consisting of iron, titanium, zirconium, aluminum, tantalum, vanadium, niobium, boron and phosphorous and is present in an amount such that the coating contains 0.1 to 30 percent by weight modifying ceramic oxide.

15. In a thin film variable resistor comprising at least 2 electrodes attached to a resistive element, the improvement comprises:
using hydrogen silsesquioxane to form the thin film resistive element.

16. The resistor of claim 15 wherein the resistor is placed in a non-oxidizing atmosphere.

17. The resistor of claim 15 wherein the resistive element is in the form of a film deposited by a process which comprises coating a substrate with a solution comprising hydrogen silsesquioxane in a solvent, evaporating the solvent to form a coating and then pyrolyzing the coating to form the resistive element.

18. The resistor of claim 17 wherein the coating is pyrolyzed at a temperature in the range of from about 100° C. to about 600° C.

19. The resistor of claim 17 wherein the solution also contains a platinum, rhodium or copper catalyst composition in an amount of about 5 to about 1000 ppm platinum, rhodium or copper based on the weight of hydrogen silsesquioxane resin.

20. The resistor of claim 15 wherein the electrodes are separated by a distance of less than about 5000 nm.

21. The resistor of claim 15 wherein the resistive element has a density between about 0.9 and about 2.1 g/cc.

22. The resistor of claim 15 wherein the electrodes are made of a material selected from the group consisting of gold, aluminum, silver, copper, platinum, nickel, cobalt gallium arsenide, and silicon.

23. The resistor of claim 17 wherein the substrate is selected from the group consisting of gold, aluminum, silver, copper, platinum, nickel, cobalt, gallium arsenide, silicon, silicon carbide, silica, alumina, aluminum nitride, and silicon nitride.

24. The resistor of claim 15 wherein the electrodes are made of gold.

25. The resistor of claim 15 wherein the resistive element is between about 50 and about 5000 nm thick.

26. The resistor of claim 15 wherein the resistive element is between about 100 and about 600 nm thick.

27. The resistor of claim 15 wherein one or more modifying ceramic oxides are incorporated in the resistive element.

28. The resistor of claim 27 wherein the modifying ceramic oxide comprises an oxide of one or more elements selected from the group consisting of iron, titanium, zirconium, aluminum, tantalum, vanadium, niobium, boron and phosphorous and is present in an amount such that the resistive element contains 0.1 to 30 percent by weight of the modifying ceramic oxide.

29. An electronic circuit containing the resistor of claim 1.

30. An electronic circuit containing the resistor of claim 15.

* * * * *

UNITED STATES PATENT AND TRADEMARK OFFICE
CERTIFICATE OF CORRECTION

PATENT NO. : 5,283,545
DATED : February 1, 1994
INVENTOR(S) : UDO C. PERNISZ

It is certified that error appears in the above-indentified patent and that said Letters Patent is hereby corrected as shown below:

In the Drawings:

SHEET 5 OF 6 OF THE DRAWINGS, FIGURE 9.

"CURRENT DENSITY IN mA/cm$^2$"  should read:

"CURRENT DENSITY IN microA/cm$^2$".

Signed and Sealed this

Fifth Day of July, 1994

Attest:

BRUCE LEHMAN

*Attesting Officer*      *Commissioner of Patents and Trademarks*